(12) United States Patent
Yeh

(10) Patent No.: US 11,758,690 B2
(45) Date of Patent: Sep. 12, 2023

(54) HEAT-DISSIPATION DEVICE ALLOWING EASY DETACHMENT FROM HEAT-GENERATING COMPONENT

(71) Applicant: Nanning FuLian FuGui Precision Industrial Co., Ltd., Nanning (CN)

(72) Inventor: Chih-Yu Yeh, New Taipei (TW)

(73) Assignee: Nanning FuLian FuGui Precision Industrial Co., Ltd., Nanning (CN)

(*) Notice: Subject to any disclaimer, the term of this patent is extended or adjusted under 35 U.S.C. 154(b) by 225 days.

(21) Appl. No.: 17/351,477

(22) Filed: Jun. 18, 2021

(65) Prior Publication Data
US 2022/0408588 A1 Dec. 22, 2022

(51) Int. Cl.
*H05K 7/20* (2006.01)
*H01L 23/40* (2006.01)

(52) U.S. Cl.
CPC ....... *H05K 7/2039* (2013.01); *H01L 23/4006* (2013.01); *H05K 7/2049* (2013.01)

(58) Field of Classification Search
CPC ............... H01L 23/40; H01L 23/4006; H01L 2023/4068; H01L 2023/4075; H01L 2023/4081; H01L 2023/4087; H05K 7/20336; H05K 7/2039; H05K 7/2049; G06F 1/20
See application file for complete search history.

(56) References Cited

U.S. PATENT DOCUMENTS

| 4,246,597 A * | 1/1981 | Cole ....................... H01L 23/40 257/713 |
| 4,753,287 A * | 6/1988 | Horne ................. H01L 23/4338 257/713 |
| 4,871,015 A * | 10/1989 | Foley .................. H01L 23/4006 174/16.3 |
| 5,010,949 A * | 4/1991 | Dehaine .............. H01L 23/4006 165/185 |
| 5,585,671 A | 12/1996 | Nagesh et al. |

(Continued)

FOREIGN PATENT DOCUMENTS

| CN | 1559164 A | 12/2004 |
| TW | 476147 B | 2/2002 |

(Continued)

*Primary Examiner* — Eric S Ruppert
*Assistant Examiner* — Hans R Weiland
(74) *Attorney, Agent, or Firm* — ScienBiziP, P.C.

(57) ABSTRACT

A heat-dissipation device with detachability against the adhesion of a paste includes a heat-dissipation structure and a detachment device. The heat-dissipation structure installed on a heat-generating component includes a base, and a heat-dissipation element disposed on the base, and a through hole penetrating through the base. The detachment device includes a housing disposed on the base and covering the through hole, wherein the housing includes a gas chamber, and a gas hole connected to the gas chamber, the gas hole being in communication with the through hole. An adjustment element is movably disposed in the gas chamber. A gas in the housing is pushed out through the gas hole by moving the adjustment element downwards, creating a positive gas pressure and thus forcing a separation between the heat-dissipation structure and the heat-generating component on which the structure is installed.

9 Claims, 6 Drawing Sheets

(56) References Cited

U.S. PATENT DOCUMENTS

| | | | | |
|---|---|---|---|---|
| 7,161,808 | B2* | 1/2007 | Atkinson | H01L 23/4006 24/457 |
| 7,280,363 | B2* | 10/2007 | Reyzin | H01L 23/4338 257/E23.094 |
| 7,474,532 | B1* | 1/2009 | Desrosiers | H01L 23/4006 165/185 |
| 2005/0072558 | A1* | 4/2005 | Whitney | H01L 23/4006 257/E23.084 |
| 2008/0197483 | A1* | 8/2008 | Ouyang | H01L 23/4006 438/122 |
| 2008/0266808 | A1* | 10/2008 | Aberg | H01L 23/4338 361/709 |
| 2009/0284930 | A1* | 11/2009 | Ice | H05K 7/20418 361/715 |
| 2010/0020498 | A1* | 1/2010 | Urai | H01L 23/40 361/709 |
| 2010/0226102 | A1* | 9/2010 | So | H05K 1/0271 361/748 |
| 2018/0150114 | A1* | 5/2018 | Lambert | H05K 7/20154 |
| 2020/0126889 | A1* | 4/2020 | Mao | H01L 23/427 |
| 2020/0159097 | A1* | 5/2020 | Chen | G03B 21/145 |
| 2020/0229318 | A1* | 7/2020 | Grau | H01L 23/4006 |
| 2020/0236805 | A1* | 7/2020 | Lin | H05K 7/20409 |
| 2021/0045254 | A1* | 2/2021 | Zhang | H05K 1/18 |

FOREIGN PATENT DOCUMENTS

| | | |
|---|---|---|
| TW | 201044520 A | 12/2010 |
| WO | 9404013 A1 | 2/1994 |

* cited by examiner

US 11,758,690 B2

HEAT-DISSIPATION DEVICE ALLOWING EASY DETACHMENT FROM HEAT-GENERATING COMPONENT

FIELD

The subject matter herein generally relates to a heat-dissipation device, especially a heat-dissipation device with easy detachability.

BACKGROUND

A heat-dissipation device is generally mounted on the chip to quickly dissipate the heat of the chip. In addition, a thermally conductive material is coated between the chip and the heat-dissipation device to increase the thermal conductivity between the chip and the heat-dissipation device.

However, when the heat-dissipation device is to be removed from the chip, the paste-like thermally conductive material retains adhesion between the heat-dissipation device and the chip, making it difficult to separate the heat-dissipation device from the chip. The chip of a server is of large size to increase the processing efficiency. When the area of the chip is larger, the adhesion between the heat-dissipation device and the chip caused by the thermally conductive material is larger, and it becomes more difficult to separate the heat-dissipation device from the chip. An easily-detachable heat-dissipation device is needed for interior access and re-usability.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
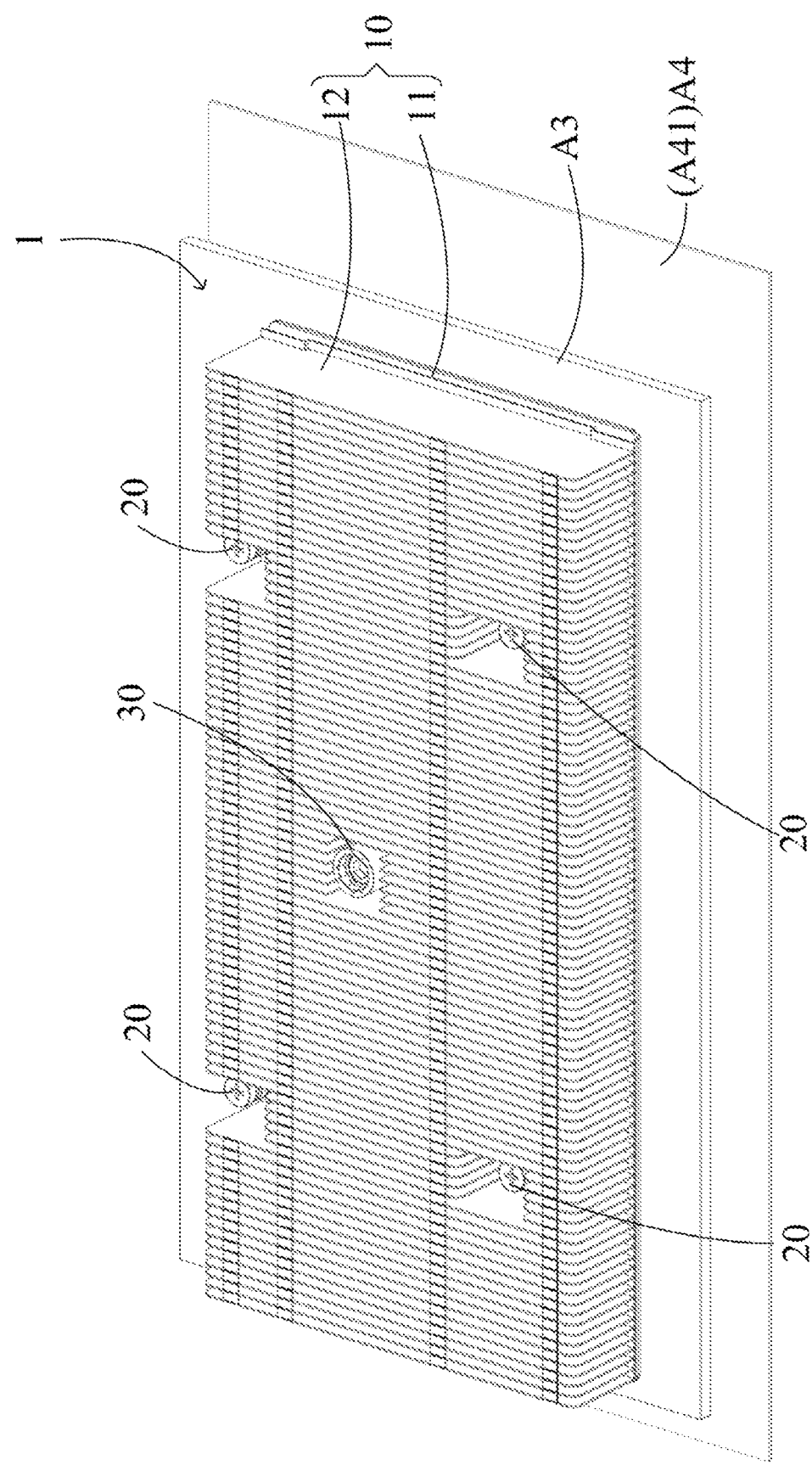
FIG. 1 is a perspective view of a heat-dissipation device with detachability in one embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connected" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 2:
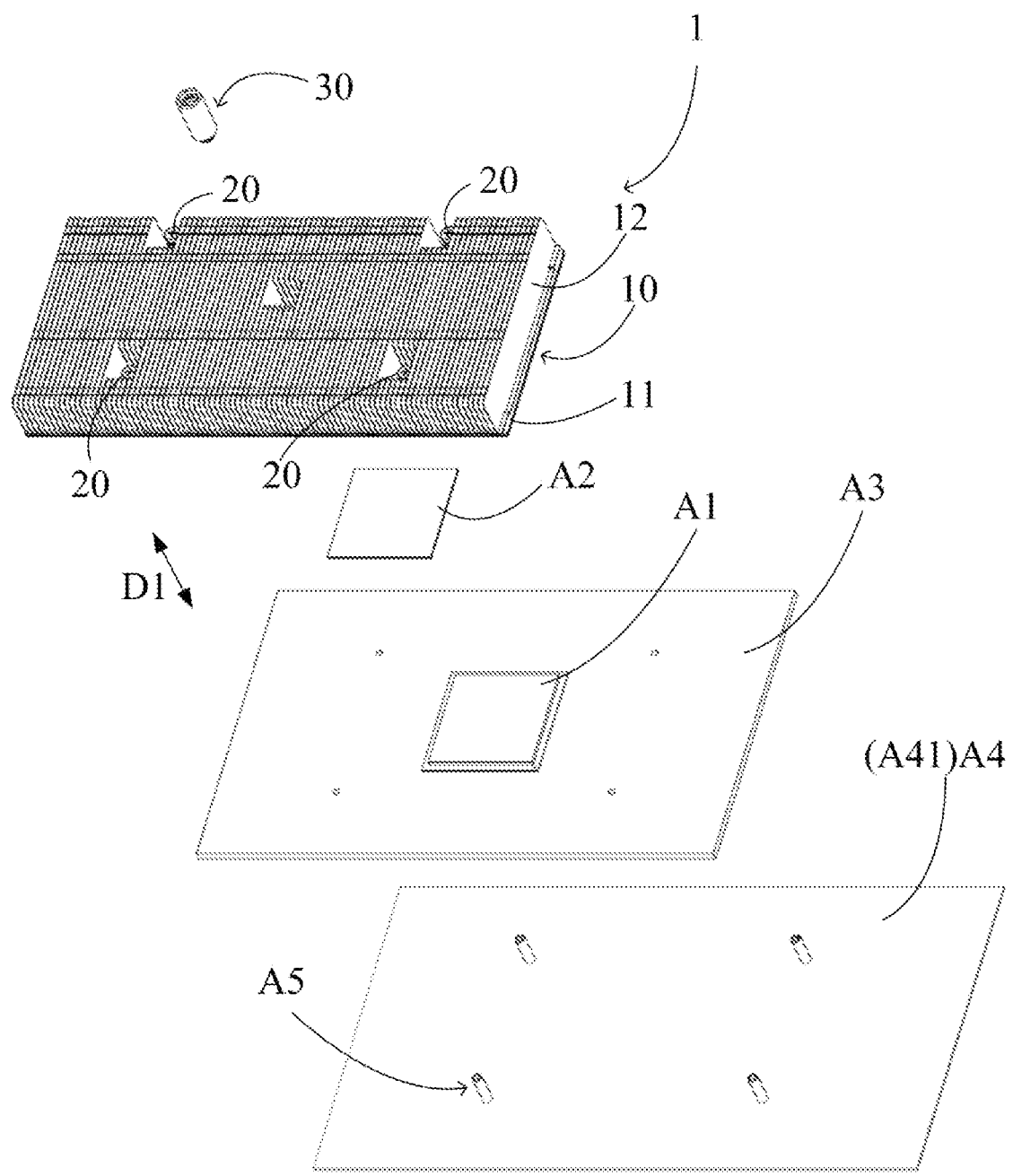
FIG. 2 is an exploded view of the heat-dissipation device of FIG. 1.
Figure 3:
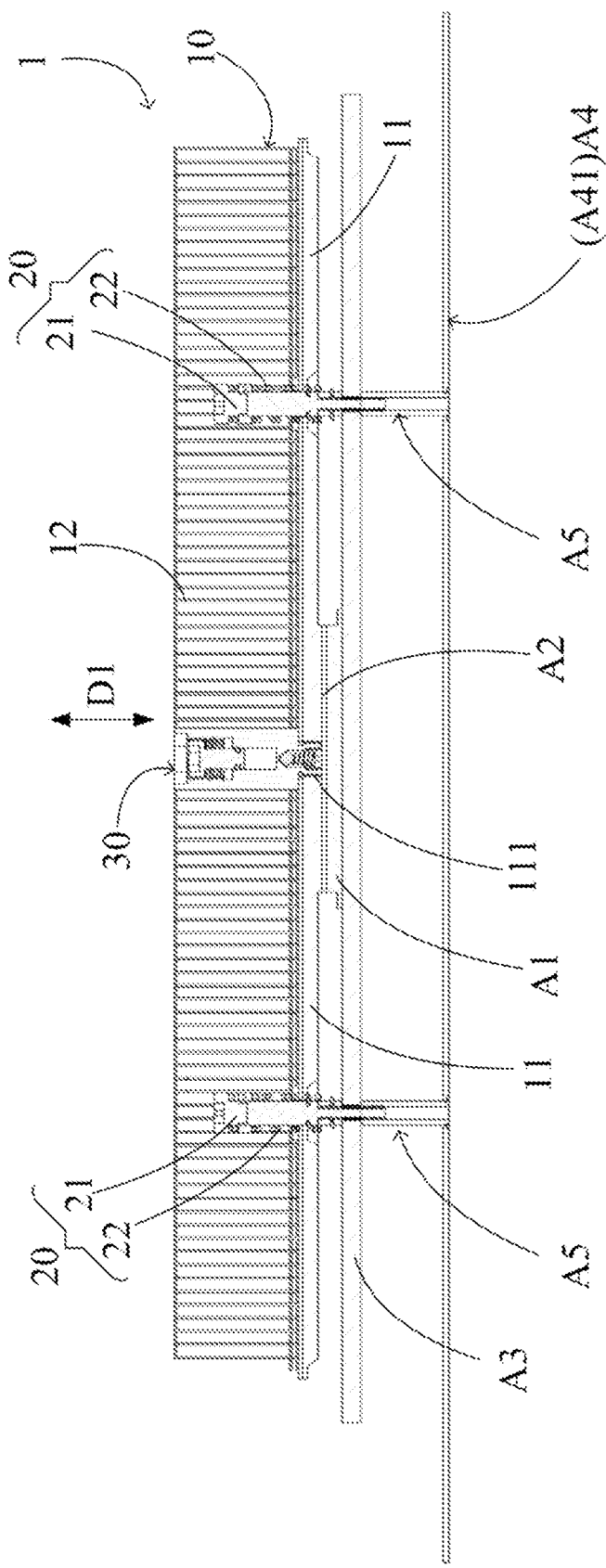
FIG. 3 is a cross-sectional view of the heat-dissipation device of FIG. 1.

FIG. 1 is a perspective view of a heat-dissipation device 1 with detachability in one embodiment of the present disclosure. FIG. 2 is an exploded view of the heat-dissipation device 1 of FIG. 1. FIG. 3 is a cross-sectional view of the heat-dissipation device 1 of FIG. 1. The heat-dissipation device 1 is configured to be disposed on the heat-generating component A1, and dissipates the heat of the heat-generating component A1. The heat-generating component A1 can be a chip, for example. In the embodiment, a thermally conductive layer A2 is between the heat-dissipation device 1 and the heat-generating component A1. The heat-generating component A1 is disposed on the circuit board A3, and the heat-dissipation device 1, the heat-generating component A1, and the circuit board A3 are disposed in the casing A4. For the purpose of clarity, part of the casing A4 is omitted in figures, and only the bottom plate A41 of the casing A4 is shown. Moreover, an electronic device including the heat-dissipation device 1, the heat-generating component A1, the thermally conductive layer A2, the circuit board A3, and the casing A4 can be a computer, a server, a laptop computer, a smart phone, or a tablet computer, but it is not limited thereto.

The heat-dissipation device 1 includes a heat-dissipation structure 10, clamping mechanisms 20, and a detachment device 30. The heat-dissipation structure 10 is disposed on the heat-generating component A1. The detachment device 30 and the clamping mechanisms 20 are disposed on the heat-dissipation structure 10. The detachment device 30 can be a vacuum-releasing device. When the heat-dissipation structure 10 is to be detached from the heat-generating component A1, the detachment device 30 provides gas between the heat-generating component A1 and the heat-dissipation structure 10, thereby reducing the adhesion between the heat-generating component A1 and the heat-dissipation structure 10.

The heat-dissipation structure 10 includes a base 11 and one or more heat-dissipation elements 12. The base 11 can be a plate-like structure. The base 11, the thermally conductive layer A2, the heat-generating component A1, the circuit board A3, and the bottom plate A41 of the casing A4 are arranged in an arrangement direction D1 in sequence, and extend perpendicular to the arrangement direction D1. The base 11 and the heat-dissipation elements 12 can be made of thermally conductive material or metal. Moreover, a through hole 111 penetrates through the base 11, and can be in the center of the base 11. The heat-dissipation elements 12 are disposed on the base 11. In the embodiment, the heat-dissipation elements 12 are fins, and parallel to each other. In another embodiment, the heat-dissipation element 12 can be a heat pipe or a liquid-cooling chamber.

The clamping mechanisms 20 are disposed on the base 11, and are configured to be connected to the circuit board A3. The clamping mechanisms 20 are configured to secure the circuit board A3 and the base 11 onto the heat-generating component A1. The clamping mechanisms 20 are at the edges of the base 11. When the clamping mechanisms 20 clamp the circuit board A3 and the base 11, the clamping mechanisms 20 are separated from the heat-generating component A1. In the embodiment, each clamping mechanism 20 includes a rod 21 and a side elastic element 22. The rod 21 extends in the arrangement direction D1. The rod 21 penetrates through the base 11, and is connected to the circuit board A3. The side elastic element 22 is disposed on the rod 21. The side elastic element 22 can be spring. One end of the side elastic element 22 abuts the top of the rod 21, and the other end of the side elastic element 22 abuts the top surface of the base 11.

In the embodiment, separation elements A5 are disposed on the bottom plate A41 of the casing A4, and the circuit board A3 is disposed on the separation elements A5. In other words, the circuit board A3 is separated from the bottom plate A41 of the casing A4 by the separation elements A5. The bottom end of the rod 21 penetrates through the circuit board A3, and is connected to the separation element A5. In the embodiment, the separation element A5 is a hollow structure, and the bottom end of the rod 21 is inserted into the separation element A5.

Figure 4:
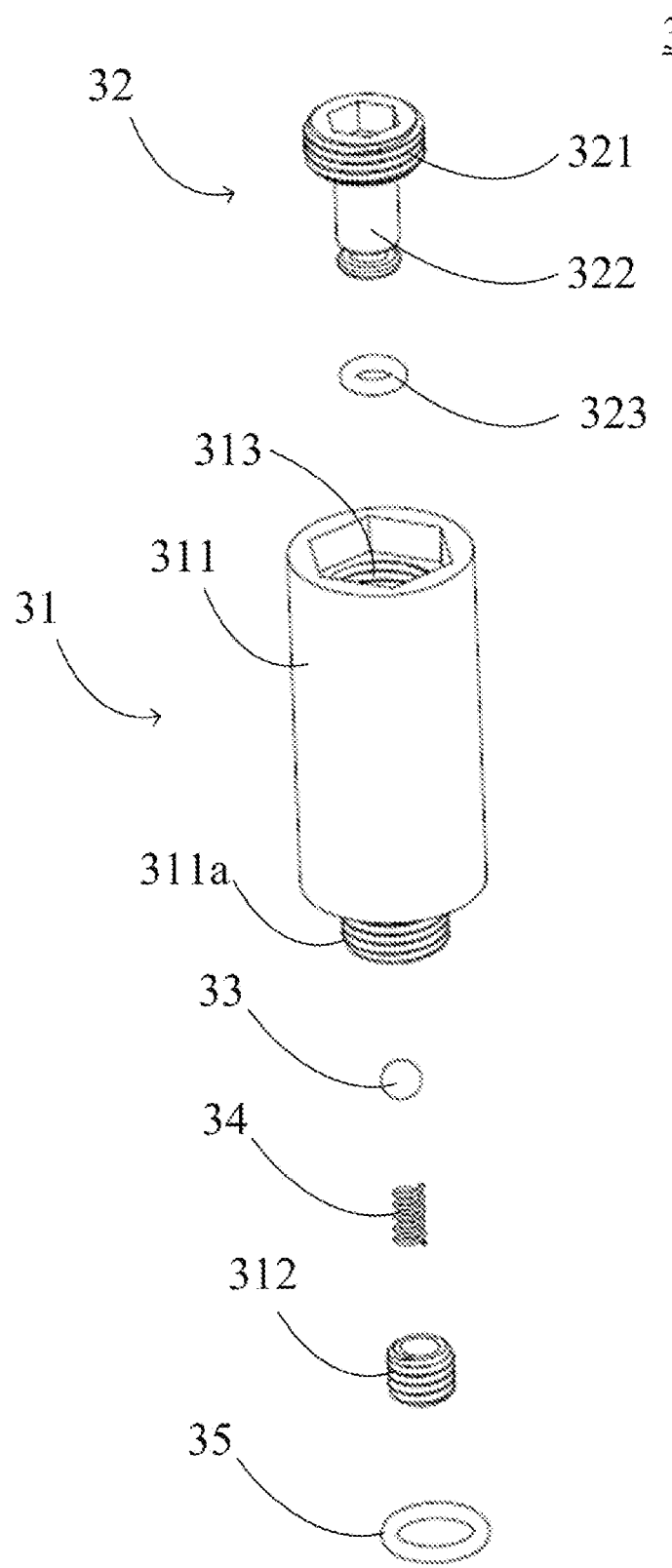
FIG. 4 is an exploded view of the detachment device in the heat-dissipation device of FIG. 1.
Figure 5:
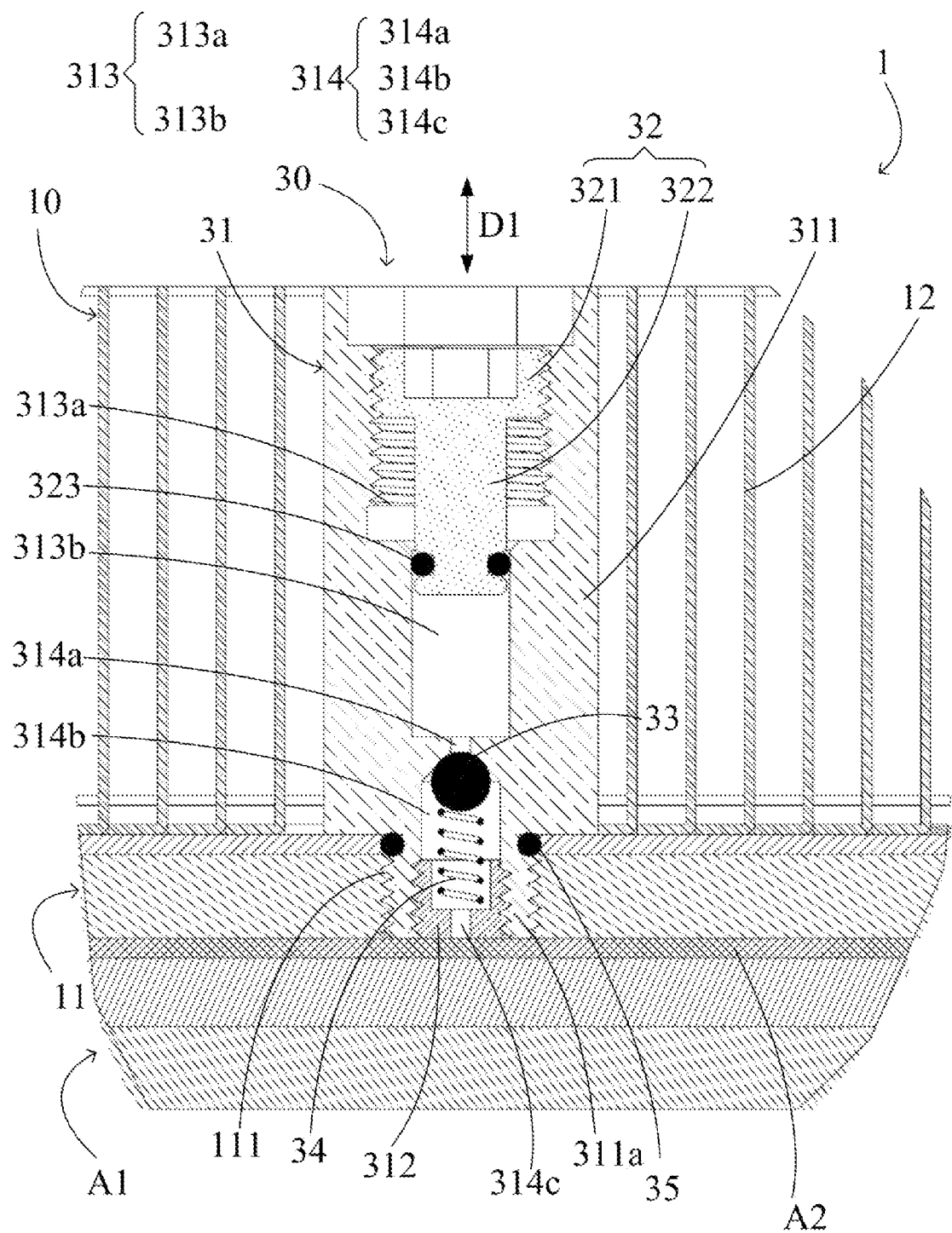
FIG. 5 shows the heat-dissipation device in FIG. 3, wherein the adjustment element is in an initial position.

FIG. 4 is an exploded view of the detachment device 30 in FIG. 2. FIG. 5 shows the adjustment element 32 in an initial position. The detachment device 30 includes a housing 31, an adjustment element 32, a block element 33, and an elastic element 34. The housing 31 is disposed on the base 11, and covers the through hole 111. The housing 31 extends perpendicular to the base 11. The housing 31 further includes a body 311 and a cover 312. The body 311 extends perpendicular to the base 11. In the embodiment, the body 311 includes a protrusion portion 311a. The outer wall of the protrusion portion 311a and the inner wall of the through hole 111 have screw threads. The protrusion portion 311a is screwed to the through hole 111.

The cover 312 is connected to the protrusion portion 311a of the body 311, and is in the protrusion portion 311a of the body 311. In the embodiment, the outer wall of the cover 312 and the inner wall of the protrusion portion 311a have screw threads. The cover 312 is screwed to the protrusion portion 311a.

The body 311 and the cover 312 are hollow structures. The housing 31 has a gas chamber 313 and a gas hole 314. The gas chamber 313 is in the body 311. The gas hole 314 is in communication with the gas chamber 313. Moreover, a portion of the gas hole 314 is in the body 311, and a portion of the gas hole 314 is in the cover 312. In another embodiment, the whole of the gas hole 314 is in the cover 312. The gas chamber 313 and the gas hole 314 are filled with gas. In the embodiment, the gas is air from the atmosphere.

In the embodiment, the housing 31 (or the body 311) is connected to the inner wall of the through hole 111, and the cover 312 and the gas hole 314 are in the through hole 111. In another embodiment, the body 311 does not include the protrusion portion 311a. The housing 31 (or the body 311) covers the top opening of through hole 111. The cover 312 and the gas hole 314 are connected to or in communication with the top opening of through hole 111. The top opening is connected to the top surface of the bottom plate A41.

The adjustment element 32 is movably disposed on in the gas chamber 313. The adjustment elements 32 regulates the internal pressure of the housing 31 when the base 11 is disposed on the heat-generating component A1 via the thermally conductive layer A2. The gas in the housing 31 is pushed out through the gas hole 314 by moving the adjustment element 32 downwards in the arrangement direction D1, creating a positive gas pressure and thus forcing a separation between the heat-dissipation structure 10 and the heat-generating component A1 on which the structure is installed.

In the embodiment, the adjustment element 32 is a T-shaped structure. The adjustment element 32 includes a rotation portion 321 and a piston portion 322. The outer wall of the rotation portion 321 and the inner wall of the first segment 313a have screw threads. The rotation portion 321 is screwed to the inner wall of the first segment 313a. The piston portion 322 is in contact with the inner wall of the second segment 313b. When the rotation portion 321 is rotated, the piston portion 322 is moved toward the gas hole 314. At this time, the gas in the gas chamber 313 exits from the gas hole 314 by the pushing of the piston portion 322.

In the embodiment, the adjustment element 32 further includes a first sealing ring 323. The first sealing ring 323 is disposed on the piston portion 322, and between the piston portion 322 and the inner wall of the second segment 313b. The first sealing ring 323 seals the gas in the gas chamber 313 and prevents leaking from the housing 31 through the gap between the adjustment element 32 and the housing 31.

The gas hole 314 includes a connection segment 314a, a containment section 314b, and an exhaust opening 314c. The connection segment 314a is connected to the bottom of the gas chamber 313. The containment section 314b is connected to the bottom of the connection segment 314a. The exhaust opening 314c is connected to the bottom of the containment section 314b, and is in the cover 312. The gas chamber 313, the connection segment 314a, the containment section 314b, and the exhaust opening 314c are arranged in the arrangement direction D1 in sequence. In the embodiment, the exhaust opening 314c is in the through hole 111. In another embodiment, the exhaust opening 314c is connected to or in communication with the top opening of the through hole 111.

The block element 33 is movably disposed in the containment section 314b. In the embodiment, the block element 33 is a ball, adjacent to the connection segment 314a. The elastic element 34 is disposed in the containment section 314b. The one end of the elastic element 34 abuts the bottom of the containment section 314b, and the other end of the elastic element 34 abuts the block element 33. The elastic element 34 applies an elastic force to the block element 33 to use the block element 33 as a seal covering the connection segment 314a.

Figure 6:
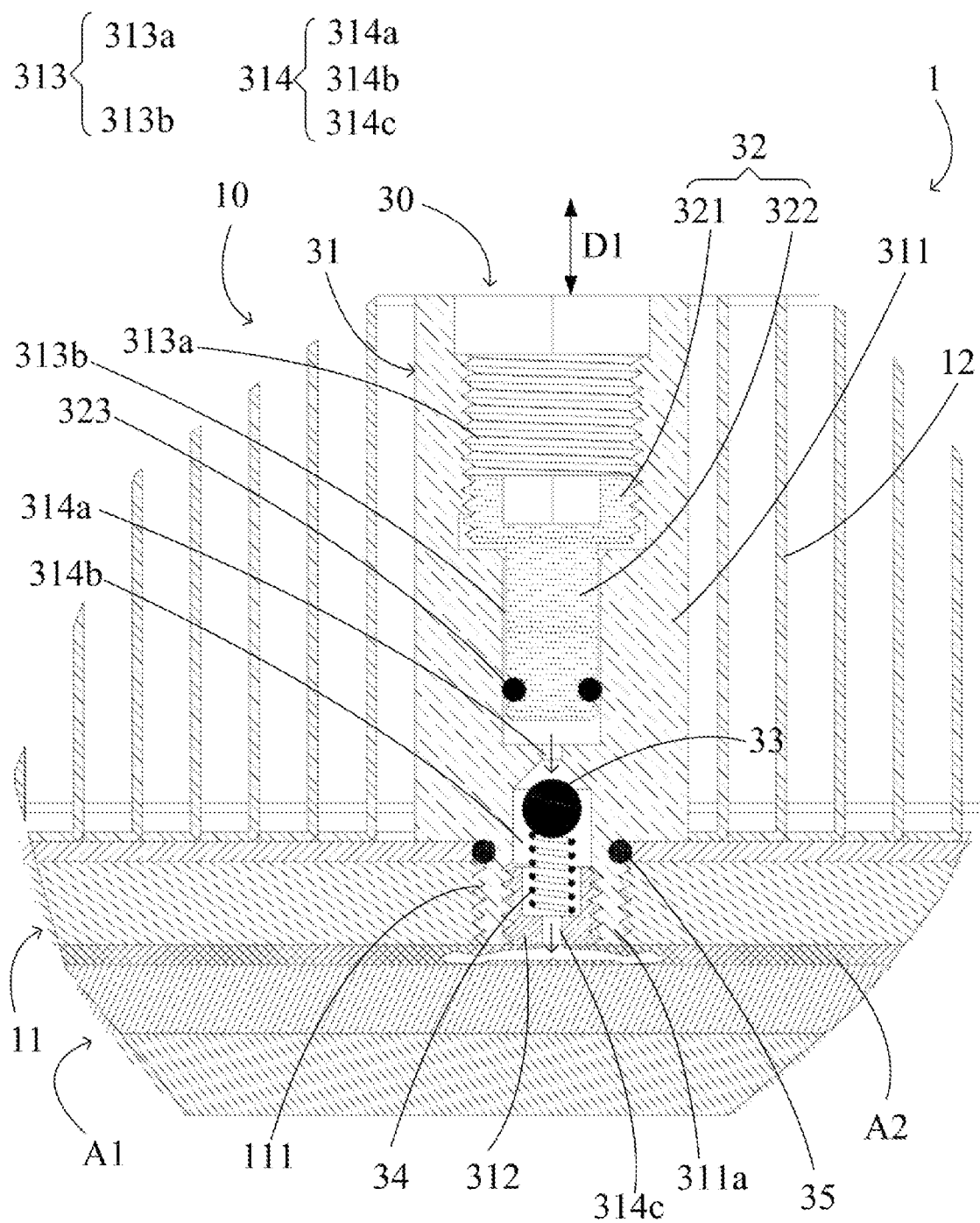
FIG. 6 shows the heat-dissipation device in FIG. 3, wherein the adjustment element is in a gas-pressuring position.

FIG. 6 shows the adjustment element 32 in a gas-pressuring position. As shown in FIG. 6, when the adjustment element 32 is moved toward the gas hole 314, the gas in the gas chamber 313 pushes the elastic element 34 toward the exhaust opening 314c. In other words, at this time, the gas in the gas chamber 31 is pushed into the containment section 314b, so that the gas in the gas hole 314 is exhausted out of the housing 31 through the exhaust opening 314c.

In the embodiment, the detachment device 30 further includes a second sealing ring 35 disposed on the housing 31. The second sealing ring 35 is between the housing 31 and the through hole 111 to prevent the gas exhausted from the detachment device 30 from leaking through the gap between the housing 31 and the base 11. Moreover, the diameter of the block element 33 is greater than the diameter of the exhaust opening 314c and the diameter of the connection segment 314a. The diameter of the block element 33, the diameter of the exhaust opening 314c, and the diameter of the connection segment 314a are measured in the same direction. Therefore, the block element 33 completely covers the lower opening of the connection segment 314a. The elastic element 34 and the block element 33 are captive in the housing 31.

As shown in FIG. 3 and FIG. 5, when the heat-dissipation device 1 is mounted on the heat-generating component A1 and the circuit board A3, the base 11 is attached onto the heat-generating component A1 via the thermally conductive layer A2 to increase the heat dissipation efficiency of the heat-generating component A1. The thermally conductive layer A2 is paste, and made of thermally conductive material. Any air or bubbles of air between base 11 and heat-generating component A1 should be removed so as not to reduce the thermal conductivity between the base 11 and the heat-generating component A1. As shown in FIG. 5, the through hole 111 is in contact with the thermally conductive layer A2. The gas in housing 31 (or the gas chamber 313 and the gas hole 314) does not flow into the thermally conductive layer A2 (or between the base 11 and the heat-generating component A1) through the exhaust opening 314c by the adjustment element 32. The block element 33 covering the connection segment 314a of the gas hole 314 prevents the gas in housing 31 (or the gas chamber 313 and the gas hole 314) from flowing into the thermally conductive layer A2 (or between the base 11 and the heat-generating component A1 through exhaust opening 314c. Therefore, the detachment device 30 does not cause air to enter between the base 11 and the heat-generating component A1, and does not significantly reduce the heat dissipation efficiency of heat-generating component A1 when the adjustment element 32 is in the initial position.

As shown in FIG. 3 and FIG. 6, when the heat-dissipation device 1 is to be detached from the heat-generating component A1, the clamping mechanisms 20 are firstly removed from the circuit board A3. Afterwards, the adjustment element 32 is rotated, so as to screw the adjustment element 32 down toward the gas hole 314. The internal pressure of the housing 31 is adjusted by the adjustment element 32, and the block element 33 is pushed to move toward the exhaust opening 314c. At this time, the gas in the gas chamber 313 pushes through the block element 33 and into the gas hole 314 by the pressure of the piston portion 322, and then the gas in the housing 31 (or the gas hole 314 and/or the gas chamber 313) is pushed out through the exhaust opening 314c of the gas hole 314 into the thermally conductive layer A2 (or between the base 11 and the heat-generating component A1). Therefore, the adhesion between base 11 and heat-generating component A1 is reduced by the gas entering between the base 11 and the heat-generating component A1, so that the heat-dissipation structure 10 is easily removed from the heat-generating component A1.

The heat-dissipation device of the present disclosure utilizes the detachment device disposed on the heat-dissipation device to facilitate removal of the heat-dissipation device from the heat-generating component. When the heat-dissipation structure is to be detached from the heat-generating component, the detachment device is rotated with a screwdriver or other simple hand tool to create gas pressure between the heat-generating component and the heat-dissipation structure, thereby reducing adhesion between the heat-generating component and the heat-dissipation structure. Therefore, the user can easily remove the heat-dissipation device from the heat-generating component.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A heat-dissipation device with detachability, comprising:
   a heat-dissipation structure comprising a base, a heat-dissipation element disposed on the base, and a through hole penetrating through the base; and
   a detachment device comprising:
      a housing disposed on the base, and covering the through hole, wherein the housing comprises a gas chamber and a gas hole in communication with the gas chamber, and the gas hole is in communication with the through hole or in the through hole, wherein the gas hole defines a connection segment connected to the gas chamber, a containment section connected to the connection segment, and an exhaust opening connected to the containment section;
      a block element movably disposed in the containment section;
      an elastic element disposed in the containment section, and applying an elastic force to the block element, so as to make the block element cover the connection segment; and
      an adjustment element movably disposed in the gas chamber;
   wherein an internal pressure of the housing is adjusted by the adjustment element,
   wherein when the adjustment element is moved toward the gas hole, the block element is pushed to move toward the exhaust opening.

2. The heat-dissipation device with detachability as claimed in claim 1, wherein the base is configured to attach onto a heat-generating component via a thermally conductive layer, and
   wherein the through hole is in contact with the thermally conductive layer.

3. The heat-dissipation device with detachability as claimed in claim 2, further comprising:
   a clamping mechanism disposed on the base, and configured to be connected to a circuit board,
   wherein the clamping mechanism clamps each of the circuit board and the base to the heat-generating component.

4. The heat-dissipation device with detachability as claimed in claim 3, wherein the clamping mechanism comprises:
   a rod penetrating through the base, and connected to the circuit board; and
   a side elastic element disposed on the rod, and abutting the base.

5. The heat-dissipation device with detachability as claimed in claim 1, wherein the housing further comprises a body, and a cover connected to the body, the gas chamber and the gas hole in the body, and the exhaust opening is in the cover.

6. The heat-dissipation device with detachability as claimed in claim 5, wherein the cover and the exhaust opening is in the through hole.

7. The heat-dissipation device with detachability as claimed in claim 1, wherein a diameter of the block element is greater than a diameter of the exhaust opening and a diameter of the connection segment, the diameter of the block element, the diameter of the exhaust opening, and the diameter of the connection segment are measured in the same direction.

8. A heat-dissipation device with detachability, comprising:
   a heat-dissipation structure comprising a base, a heat-dissipation element disposed on the base, and a through hole penetrating through the base; and
   a detachment device comprising:
   a housing disposed on the base, and covering the through hole, wherein the housing comprises a gas chamber and a gas hole in communication with the gas chamber, and the gas hole is in communication with the through hole or in the through hole; and
   an adjustment element movably disposed in the gas chamber;
   wherein an internal pressure of the housing is adjusted by the adjustment element,
   wherein the gas chamber comprises a first segment and a second segment connected to the gas hole, and the adjustment element comprises:
   a rotation portion screwed to an inner wall of the first segment; and
   a piston portion in contact with an inner wall of the second segment,
   wherein when the rotation portion is rotated, the piston portion is moved toward the gas hole.

9. The heat-dissipation device with detachability as claimed in claim 8, wherein the through hole is in a center of the base, the housing extends perpendicular to the base, and is connected to an inner wall of the through hole.

* * * * *